United States Patent [19]
Paillardet et al.

[11] Patent Number: 5,696,510
[45] Date of Patent: Dec. 9, 1997

[54] DOUBLE-INPUT ANALOG-TO-DIGITAL CONVERTER USING A SINGLE CONVERTER MODULE

[75] Inventors: Frédéric Paillardet, Grenoble; Francis Dell'Ova, St. Hilaire du Touvet; Bruno Bonhoure, Grenoble, all of France

[73] Assignee: Thomson Multimedia S.A., Courbevoie, France

[21] Appl. No.: 443,517

[22] Filed: May 18, 1995

[30] Foreign Application Priority Data

May 24, 1994 [FR] France .................. 94 06264

[51] Int. Cl.⁶ .................. H03M 1/14; H03M 1/34
[52] U.S. Cl. .................. 341/156; 348/572; 341/158
[58] Field of Search .................. 341/156, 159, 341/141, 122, 158; 348/572

[56] References Cited

U.S. PATENT DOCUMENTS

| | | | |
|---|---|---|---|
| 4,791,488 | 12/1988 | Fukazawa et al. | 348/537 |
| 4,893,122 | 1/1990 | Hoehn | 341/122 |
| 4,903,028 | 2/1990 | Fukushima | 341/156 |
| 5,349,354 | 9/1994 | Ito et al. | 341/156 |

FOREIGN PATENT DOCUMENTS

| | | |
|---|---|---|
| 0586113A2 | 3/1994 | European Pat. Off. . |
| 2190258 | 11/1987 | United Kingdom . |
| 2214738 | 9/1989 | United Kingdom . |

OTHER PUBLICATIONS

An 8 MHz CMOS Subranging 8–Bit A/D Converter, A.G.F. Dingwall, & V. Zazzu, IEEE Journal of Solid–State Circuits, vol.SC–20, No. 6, pp. 1138–1143, Dec. 1985.

THPM 24.3, CMOS, 1µ, 8b, 50MHz Averaging Flash A/DC Building Block, A.G.F. Dingwall et al., (no publication date).

Primary Examiner—Jeffrey A. Gaffin
Assistant Examiner—Thuy-Trang N. Huynh
Attorney, Agent, or Firm—Joseph S. Tripoli; Frederick A. Wein

[57] ABSTRACT

The disclosure is an analog-to-digital converter of half-flash type providing for the multiplexing of two analog input signals and therefore requiring only one converter module. It includes a coarse comparator block used to determine the most significant bits of the converted signals and also determining the voltage range for two fine comparator blocks that determine the least significant bits of the converted signals, wherein each of the input signals is connected to a fine comparator block and said coarse comparator block compares alternatively the first and second input signals with a reference voltage. The analog-to-digital converter can be advantageously used for processing television signals.

8 Claims, 4 Drawing Sheets

DOUBLE-INPUT ANALOG-TO-DIGITAL CONVERTER USING A SINGLE CONVERTER MODULE

BACKGROUND OF THE INVENTION

The invention concerns an analog-to-digital converter (ADC) of the half-flash type providing multiplexing of two analog signals and requiring only a single converter module. This converter is advantageously used for processing television signals.

For the transmission and processing of video signals we use three types of signal: the luminance signal Y and the chrominance (color difference) signals U and V. The pass band of the signal Y being higher that of the signals U and V, in ADCs it is necessary to convert the sampling frequency of the Y signal to twice that of the two U and V signals. This raises the problem of simultaneous analog-to-digital conversion of several signals.

To resolve this problem, two techniques can be used. The first involves the use of three ADCs to digitize the Y signals at frequency fs and the U and V signals at frequency fs/2. This logical solution has the advantage of simplicity but increases power consumption and the size of components. The second solution is to use only two ADCs, which is possible if these are used with an analog multiplexer to multiplex the U and V signals, which are then digitized at frequency fs/2 in the first ADC. The second ADC is used to digitize the Y signal at frequency fs. This second solution uses less power but its major drawback lies in the difficulty of making the analog multiplexer (speed, linearity, etc.).

There exist several types of ADCs; some provide high conversion speed; others are slower but use less power or are smaller. A technique used widely is to make the analog-to-digital conversion in two steps. In the first step, the voltage to be converted at frequency fs is determined approximately. This establishes the most significant bits (MSBs) of the converted voltage. Knowing this voltage approximately, in the second cycle, at a time 1/fs later, a finer comparison is made to establish the least significant bits (LSBs) of the converted voltage. Since the first step is more rapid than the second, two fine comparator blocks are used in order to enable two fine comparisons for each coarse comparison.

FIG. 1 shows an ADC of this type using one coarse comparator block 1 and two fine comparator blocks 2 and 3. The range of voltages between $V_{min}$ and $V_{max}$ is divided into n+1 equal intervals giving n reference voltages, each interval being divided into m+1 equal sub-intervals giving m reference voltages in each of the larger intervals using the resistor matrix 4. The coarse comparator block 1 receives as reference voltages the n voltages equal to $V_{min}+k \cdot (V_{max}-V_{min})/(n+1)$, where k ranges from 1 to n. The approximate voltage interval determined by the coarse comparator block 1 is divided into n intervals then fed to the fine comparator block 2 or 3. The reference voltages thus selected are then compared with the voltage to be converted $V_{in}$. The outputs from comparator blocks 1, 2 and 3 have respectively n, m and m bits which are coded by the coders 5, 6 and 7 to give the MSBs and the LSBs.

In order to correct the deviations between the voltage references fed to the coarse comparator block 1 and the fine comparator blocks 2 and 3, an extra p references are fed to the fine comparators 2 and 3. These p references correspond to fine intervals adjacent to the large interval determined by the coarse comparator block 1. The fine comparators 2 and 3 then have m+p comparators in parallel. These supplementary references will be used, if need be, to correct the LSB(s) among those determined by the coarse comparator block. The correction circuits 8 and 9 correct in a known manner the bit concerned provided by the coarse comparison. FIG. 2 shows the timing diagram for the comparators 1, 2 and 3; a complete cycle of two coarse comparisons is shown. During the first period $T_1$ of the clock signal, the coarse comparator block 1 samples the signal $V_{in}$, then compares it with the n reference voltages. During this time, the fine comparator block 2 will also have sampled and held (blocked) the signal $V_{in}$. At the start of the second period $T_2$, the blocking is maintained, in order to allow the fine reference voltages to stabilize (hatched part). The fine comparison can now be made. During this second period, the coarse comparator 1 samples the signal $V_{in}$ a second time, this time for the second fine comparison of the comparator block 3. An example of such a half-flash type ADC as described above is given in the French patent application n°93 12026 filed by Thomson Consumer Electronics.

SUMMARY OF THE INVENTION

The present invention includes the advantages of the two techniques mentioned earlier, notably simplicity and low consumption, while avoiding their disadvantages. Its principle is based on the use, as described above, of an analog-to-digital converter module of half-flash type including two "fine comparator" blocks and a "coarse comparator" block. The present invention therefore concerns an analog-to-digital converter with two analog input signals that includes a coarse comparator block and two fine comparator blocks, said coarse comparator block being used to determine the most significant bits of the converted signals and also determining the voltage interval for said fine comparator blocks that determine the least significant bits of the converted signals, wherein each of the input signals is connected to a fine comparator block and said coarse comparator block compares alternatively said first and second input signals with a reference voltage. An important characteristic of the invention is that each of the two input signals is connected to a fine comparator block and that the coarse comparator block includes comparators that compare alternatively the first voltage sampled and the second voltage sampled at the same reference voltage.

Another important characteristic of the invention is that the comparators of the coarse comparator block are auto-zeroing comparators that compare alternatively the first and second voltages with the same reference voltage. Similarly, the comparators of the fine comparator blocks can advantageously be auto-zeroing comparators.

The invention is advantageously applicable to converters using MOS technology and used for processing television U and V chrominance signals.

The invention provides a converter that is simpler and smaller than known converters and uses less energy.

BRIEF DESCRIPTION OF THE DRAWINGS

The invention will be better understood and other advantages will become clear on reading the following description making reference to the appended figures, of which.

For reasons of clarity, parts having the same functions have the same labels in all the figures.

Figure 3A:
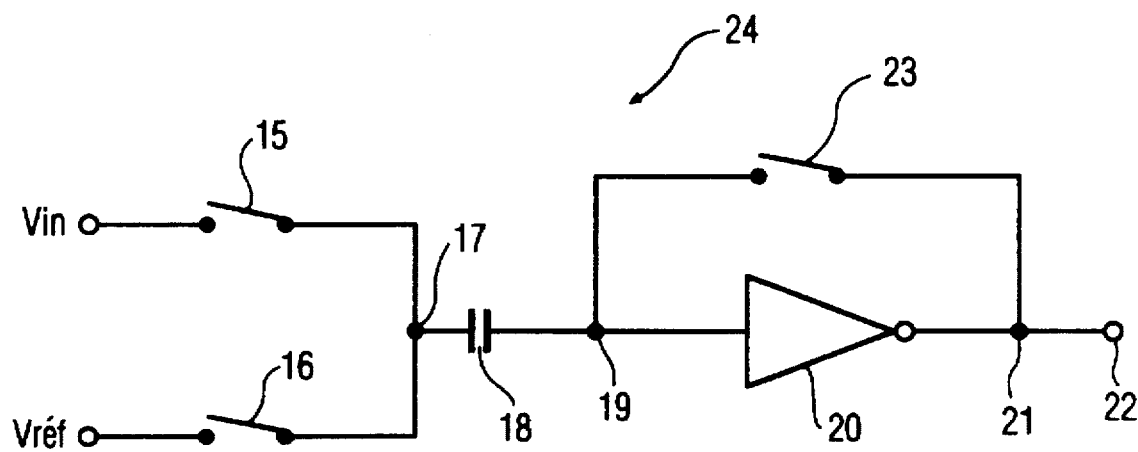
FIGS. 3a and 3b show examples of comparator devices constituting the fine and coarse comparator blocks of the analog-to-digital converter according to the invention.
Figure 3B:
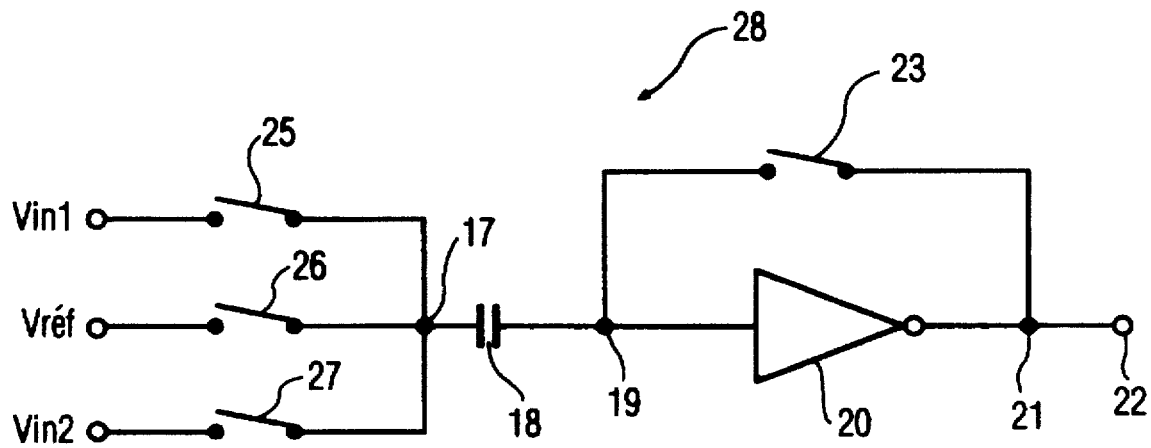

FIGS. 3a shows a so-called "auto-zeroing" comparator comprising two inputs: $V_{in}$ for the voltage to compare and $V_{ref}$ for the reference voltage. These two inputs, controlled by switches 15 and 16, are connected via the node 17 to the load capacitor 18. The capacitor 18 is connected in series with the node 19, the inverter 20, the node 21 and the output 22. A switch 23 in parallel with the inverter 20 connects the nodes 19 and 21. The auto-zeroing function is assured by the closing of the switch 23 which polarizes the inverter 20 in the threshold zone $V_{dd}/2$, where $V_{dd}$ is the circuit's supply voltage, thus making it very sensitive to the voltage across the capacitor 18. In a similar manner, FIG. 3b shows an auto-zeroing comparator extended to compare two input voltages $V_{in1}$ and $V_{in2}$ with the reference voltage $V_{ref}$. The double comparison ($V_{in1}$ with $V_{ref}$ and $V_{in2}$ with $V_{ref}$) is simply performed using the switches 25, 26 and 27.

Figure 1:
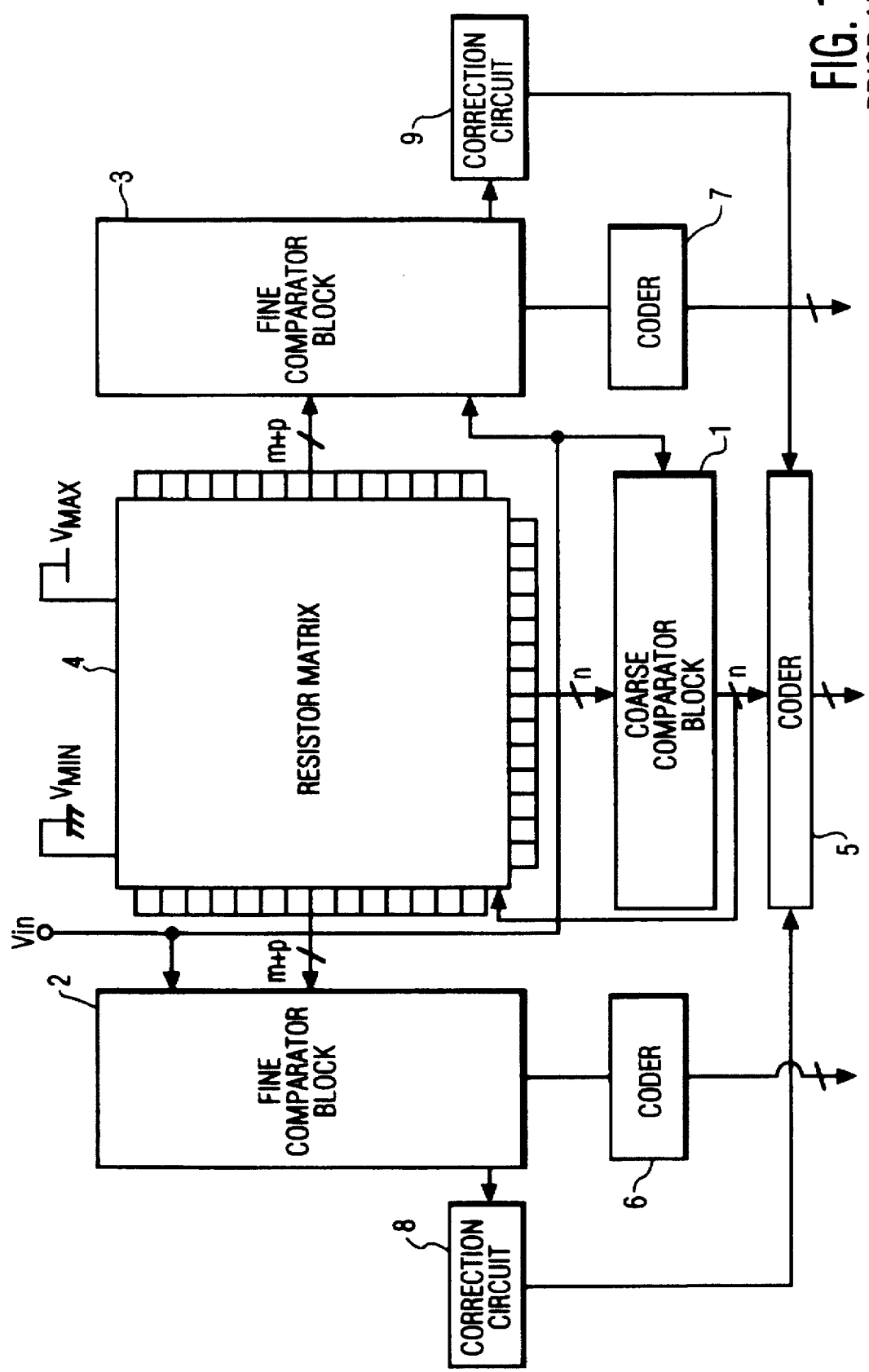
FIG. 1, described above, is a block diagram of a prior-art half-flash analog-to-digital converter.
Figure 2:
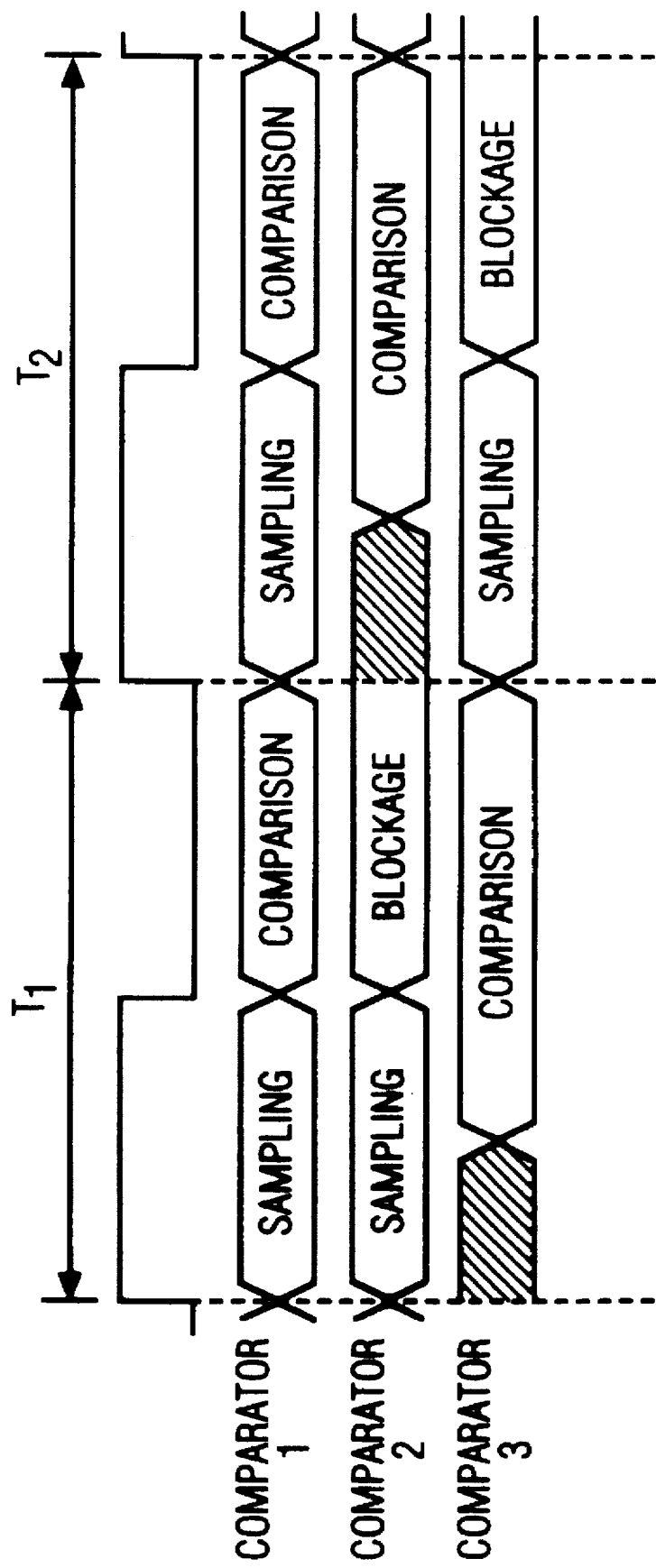
FIG. 2, described above, shows the timing of the conversion cycles of the fine and coarse comparator blocks of the ADC of FIG. 1.
Figure 4:
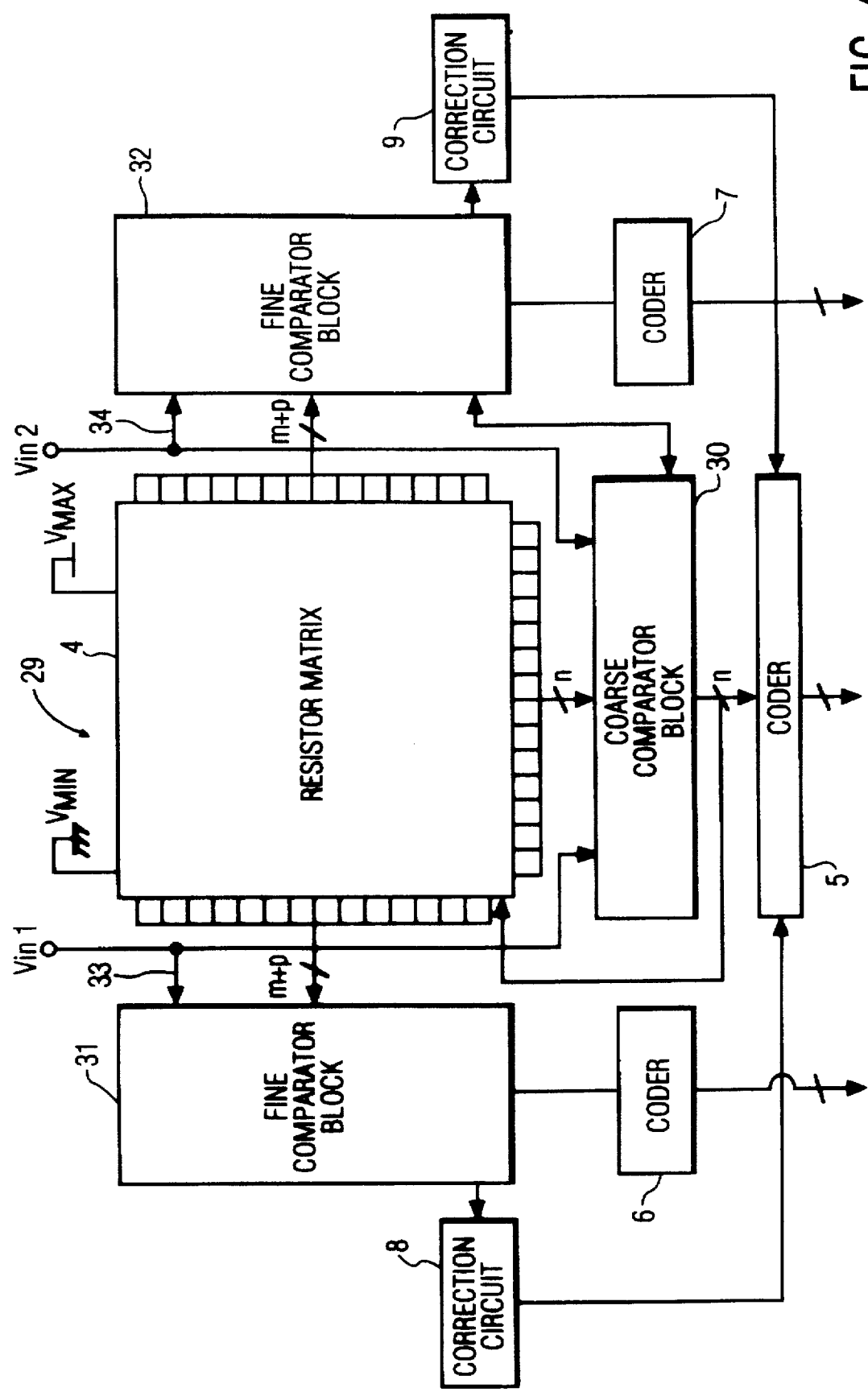
FIG. 4 is a block diagram of an embodiment of the analog-to-digital converter according to the invention.

In the embodiment shown in FIG. 4, an ADC with two analog signals $V_{in1}$ and $V_{in2}$ includes two fine comparator blocks 31 and 32. A important feature of the invention is that the first comparator block 31 receives the first signal $V_{in1}$ via the connection 33 and the second comparator block 32 receives the second signal $V_{in2}$ via the connection 34, these fine comparator blocks 31 and 32 being constituted by a set of auto-zeroing comparators 24 of the type shown in FIG. 3a. Moreover, another important feature of the invention is that the two analog signals to be converted $V_{in1}$ and $V_{in2}$ are connected in parallel to the coarse comparator block 30 which is constituted by a set of auto-zeroing comparators 28 of the type shown in FIG. 3b. The other parts 4, 5, 6, 7, 8 and 9 of FIG. 4 have the same functions as those in FIG. 1.

We see that the converter 29 according to the invention in FIG. 4 is equivalent to a double ADC operating at frequency fs/2. The double coarse comparison is assured by the coarse comparator block 30 constituted by the comparators 28 according to FIG. 3b which compare alternatively $V_{in1}$ with $V_{ref}$ and $V_{in2}$ with $V_{ref}$. The fine comparison is made using the comparator block 31 for the $V_{in1}$ signal and comparator 32 for the $V_{in2}$ signal. The overall conversion frequency is fs, but the digitized values of $V_{in1}$ and $V_{in2}$ are output at frequency fs/2.

We clearly see that the converter 29 according to the invention has many advantages including the fact that it converts two different input signals at fs/2 without supplementary power consumption compared with a single analog-to-digital conversion at frequency fs. Moreover this advantage in terms of consumption and size of the converter is also achieved in the application mentioned earlier of the processing of three video signals Y, U and V. Compared with a prior-art solution of the type described earlier, the invention eliminates the need for a peripheral analog multiplexer. In addition, the structure of the ADC according to the invention, as described in FIG. 4, assures the isolation of the signals $V_{in1}$ and $V_{in2}$, the fine comparison being independent for each input signal.

The invention can be applied to all types of analog-to-digital converters accepting two input signals $V_{in1}$ and $V_{in2}$, notably those used for processing the chrominance signals U and V of a television signal.

What is claimed is

1. Analog-to-digital converter with two analog input signals comprising;
   a coarse comparator block, and
   two fine comparator blocks,
   said coarse comparator block being used to determine most significant bits of converted signals and also determine a voltage interval for said fine comparator blocks that determine least significant bits of converted signals,
   wherein each of the input signals is coupled to one of the fine comparator blocks, and said coarse comparator block compares alternatively said first and second input signals with a reference voltage.

2. Device according to claim 1, wherein said coarse comparator block auto-zeroing comparators that compare alternatively said first and second input signals with the same reference signal.

3. Device according to claim 1, wherein said fine comparator blocks include auto-zeroing comparators.

4. Device according to claim 1, wherein the comparators included in said coarse comparator block have a first input for said first analog input signal, a second input for said reference signal, and a third input for said second analog input signal,
   each input is controlled by a switch and connected to the same node,
   a capacitor and an inverter are connected in series to said node, and
   a switch is connected across inverter.

5. Device according to claim 1 that makes use of MOS technology.

6. Device according to claim 1, wherein said two analog input signals are analog chrominance signals of a television signal.

7. Device for analog-to-digital conversion of television signals, including a first analog-to-digital converter module used to convert analog chrominance signals, and a second analog-to-digital converter module used to convert the luminance signal,
   wherein each of the first and second analog-to-digital converter modules comprising:
   means for receiving two analog input signals,
   a coarse comparator block, and
   two fine comparator blocks,
   said coarse comparator block being used to determine most significant bits of converted signals and also determine a voltage interval for said fine comparator blocks that determine least significant bits of converted signals,
   wherein each of the input signals is coupled to one of the fine comparator blocks and said coarse comparator block compares alternatively said first and second input signals with a reference voltage.

8. Digital television device including at least one analog-to-digital converter,
   the analog-to-digital convert comprising:
   means for receiving two analog input signals,
   a coarse comparator block, and
   two fine comparator blocks,
   said coarse comparator block being used to determine most significant bits of converted signals and also determine a voltage interval for said fine comparator blocks that determine least significant bite of converted signals,
   wherein each of the input signal is coupled to one of the fine comparator blocks and said coarser comparator block compares alternatively said first and second input signals with a reference voltage.

* * * * *